(12) United States Patent
Dewes et al.

(10) Patent No.: US 7,880,113 B2
(45) Date of Patent: Feb. 1, 2011

(54) PLASMA DISCHARGE METHOD AND STRUCTURE FOR VERIFYING A HERMETICAL SEAL

(75) Inventors: Brian E. Dewes, Noblesville, IN (US); Denise R. Dewes, Noblesville, IN (US); Richard D. Harlan, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 1111 days.

(21) Appl. No.: 11/601,878

(22) Filed: Nov. 17, 2006

(65) Prior Publication Data

US 2007/0128759 A1 Jun. 7, 2007

Related U.S. Application Data

(60) Provisional application No. 60/741,260, filed on Dec. 1, 2005.

(51) Int. Cl.
*B23K 10/00* (2006.01)
(52) U.S. Cl. .............................. 219/121.36; 219/121.52; 219/121.48; 315/169.2

(58) Field of Classification Search ............ 219/121.36, 219/121.52, 121.59, 121.48, 121.58; 361/681, 361/682; 315/495, 169.2
See application file for complete search history.

(56) References Cited

U.S. PATENT DOCUMENTS

| | | | | |
|---|---|---|---|---|
| 2,630,551 | A * | 3/1953 | Starbuck | 324/414 |
| 6,370,019 | B1 * | 4/2002 | Matthies et al. | 361/679.22 |
| 6,987,400 | B2 * | 1/2006 | Toro-Lira | 324/770 |
| 7,622,782 | B2 * | 11/2009 | Chu et al. | 257/415 |

* cited by examiner

*Primary Examiner*—Mark H Paschall
(74) *Attorney, Agent, or Firm*—Jimmy L. Funke

(57) ABSTRACT

A method and structure use characteristics of a plasma discharge for verifying a hermetic seal. The plasma discharge is created in a hermetically sealed cavity by a pair of spaced electrodes that extend from tips inside the hermetically sealed cavity to contacts outside the sealed cavity. An electrical bias is applied to the contacts that is sufficient to create a plasma discharge in a properly hermetically sealed cavity but not in an unsealed cavity.

14 Claims, 3 Drawing Sheets

US 7,880,113 B2

PLASMA DISCHARGE METHOD AND STRUCTURE FOR VERIFYING A HERMETICAL SEAL

RELATED PATENT APPLICATION

This patent application claims priority of U.S. Provisional Patent Application No. 60/741,260 filed Dec. 1, 2005.

BACKGROUND OF THE INVENTION

Within the semiconductor industry, both package level and device level hermetic sealing is employed to create, enable, and ensure a necessary and stable operating environment. For instance, many Micro Electrical Mechanical Systems (MEMS) employ multiple device wafers joined together into a functional stack that require a hermetically sealed environment. In particular, micro-sensor devices that are formed in silicon device wafers are often protected from the atmosphere by bonding a cap wafer to the top surface of the device wafer. When the bond is not complete the seal is compromised and there is a leak path into the interior of the device allowing air, moisture and other contaminants to enter through the leak path. If the seal is compromised, the device may not function optimally and even may be rendered completely inoperable. For devices requiring a vacuum or sub-atmospheric pressure, loss of seal integrity allows entry of air causing inaccurate operation or loss of functionality of the device. Moreover, moisture in the incoming air can cause moving parts to stick together permanently and may freeze at low temperatures impeding movement of mechanical portions of the device preventing necessary response to mechanical or electrical stimuli. Particulates and packaging material in the incoming air, such as protective, stress-relieving, or dielectric gels can also interfere with the device operation.

Inevitably, some seals are compromised or malformed during the manufacturing process. It is most economical to test hermeticity as soon as possible after the seal is made. It follows then that for device level sealing a device level test is desirable and that for package level sealing a package level test prior to integration onto a printed circuit board (PCB) or other device wafer is desirable. Such tests ensure that defective devices are not shipped and may avoid further costly processing of defective devices.

Processes for seal leak detection are already known. U.S. Pat. No. 6,074,891 granted to Steven Edward Staller Jun. 13, 2000, discloses a process and semiconductor device for verifying a hermetic seal that uses an unpassivated junction diode for leak detection. The reverse diode characteristics of a junction diode of proper size become unstable when moisture or liquid water is present. Bonding of a cap wafer to a device wafer often takes place in a controlled atmosphere and/or in a vacuum. Theoretically any device comprising a device wafer and a cap wafer that is not hermetically sealed may be detected electronically at wafer test when there is water vapor present in the air. According to the Staller '891 patent, water vapor in air of greater than about 40% relative humidity causes measurable instability in the junction diode.

In high volume testing conditions, sealing a cap wafer to a device wafer in air of variable humidity occasionally allows a leaky device to escape detection. Thus in a modified process, liquid water is forced into any improperly sealed device to assure an unstable unpassivated junction diode. Furthermore, when the leak path is large, the liquid water that was forced into the leaky device may drain out allowing the device cavity to dry out, so that the unpassivated junction diode may not be measurably instable. Thus, an unsealed device may not be identified at wafer test. Consequently, there is a time constraint between the water soak and the wafer test and an additional inspection of the cap wafers is often required to help contain devices with large holes that may not be detected at wafer test.

Further complicating leak detection, sensor device sizes are shrinking because economies of scale allow for similar functionality on smaller and smaller devices. It follows, then, that the volume within the cavity of a sensor device are getting smaller as well. A smaller volume holds less water on and reduces the amount of time the bare or unpassivated junction diode is able to detect a leaky device. A reduced device size does not shorten the necessary electrical functional test or the time required to tests each device. Thus a wafer with smaller devices will have a proportionally longer residence time on the tester for the same set of functional tests. This is not insignificant. For instance, a wafer with 50% more devices on the slice takes approximately 50% more time to test, which increases the time that water may be draining out of leaky devices and evaporating from the unpassivated junction diode. This increases the likelihood of a test escape, and significantly tightens the time constraints on the test floor between the water soak and wafer test.

The act of applying a physical stimulus, such as moisture introduction, has several inherent problems in addition to those discussed above. First, the simple task of introducing moisture requires several post process operations atypical of common semiconductor manufacturing flows. This inherently adds cost and complexity to the fabrication process. Secondly, if the stimulation is either not applied or inappropriately applied the junction diode may not be measurably unstable. Again resulting in the risk that a poorly sealed device may not be identified.

A further drawback of the leak detection method disclosed by the Staller '891 patent is that the method requires the reliable formation of an unpassivated junction diode. A manufacturing defect that fails to unpassivate the diode structure is not sensitive to moisture. This in turn causes the structure to respond as if the device is properly sealed. Furthermore, many MEMS structures of interest, capacitive, thermal, etc. simply do not require the use of multiple P or N-type dopant diffusions necessitated by a junction diode. This makes the formation of a junction diode either costly or in some cases virtually impossible limiting the applicability of the Staller leak detection method to a narrow range of sealed devices.

Lastly, the silicon or package area required to support the junction diode detection structure known in the prior art is extensive. In recent years device area for commonly manufactured MEMS has reduced significantly whereas, leak detection structures have not. This makes incorporation of leak detection structure, such as an unpassivated junction diode progressively more expensive.

SUMMARY OF THE INVENTION

This invention provides a plasma discharge method and structure for verifying a hermetical seal.

This invention solves one or more problems of the prior art noted above and affords other novel characteristics not offered by current seal leak detection technology.

DETAILED DESCRIPTION OF PREFERRED EMBODIMENT(S) OF THE INVENTION

The characteristics of a plasma discharge that are used to verify a hermetically sealed device. A seal verification structure and method for using the electrical characteristics of a plasma discharge to verify a hermetically sealed device are described in connection with FIGS. 1 to 6.

Figure 1:
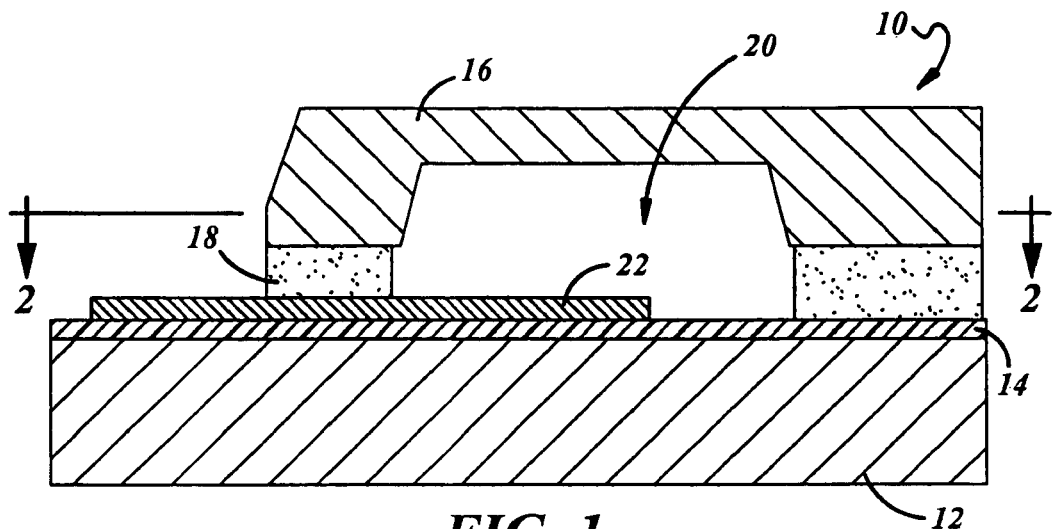
FIG. 1 is a cross-sectional view of a sealed semiconductor device (taken substantially along the line 1-1 of FIG. 2 looking in the direction of the arrows) that includes seal verification structure for verifying a hermetic seal in accordance with the invention.
Figure 2:
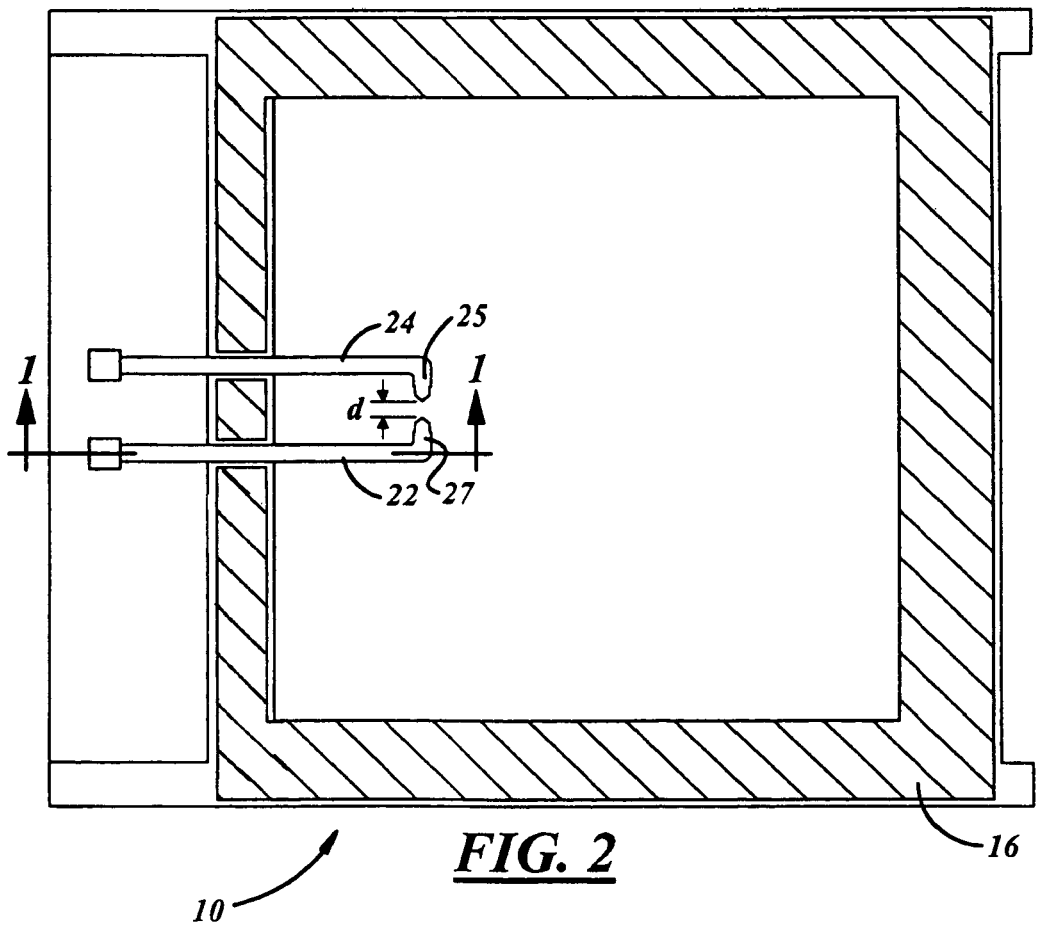
FIG. 2 is a sectional view of the device of FIG. 1 taken substantially along the line 2-2 of FIG. 1 looking in the direction of the arrows.

FIGS. 1 and 2 show a sealed semiconductor device 10 comprising a silicon device wafer 12 having an insulating dielectric 14 bonded to a silicon cap wafer 16 by a sealant 18 such that a device, such as a micromachine (not shown) is enclosed within a hermetically sealed cavity 20. Although a silicon device wafer 12 and silicon cap wafer 16 are described in the preferred embodiment, other substrates may be used for the formation of the device or cap wafers such as glass, ceramic, gallium arsenide, silicon carbide, or the like. Suitable materials for sealant 18 include glass frit, solder, metals, adhesive, benzocyclobutene (BCB) or the like that are familiar to one skilled in the art. Moreover, the hermetic seal represented by the sealant 18, may be formed by various methods such as silicon direct, anodic, thermocompression, glass frit or other well known methods.

Semiconductor device 10 includes seal verification structure for verifying the hermetic seal of the hermetically sealed semiconductor device 10 comprising two electrodes 22, 24 in a co-planar arrangement. Electrodes 22 and 24 are preferably photolithographically formed using standard semiconductor techniques on top of insulating dielectric 14. Respective portions and terminations 25, 27 of electrodes 22, 24 are disposed inside the hermetically sealed cavity 20. Terminations 25 and 27 have pointed tips that are separated by a horizontal gap or distance d that is predetermined as explained below. To verify the hermetic seal of the hermetically sealed cavity 20, formed by the sealant 18, an electrical bias is applied between the pair of electrodes 22, 24 such that a plasma discharge occurs in a properly sealed semiconductor device. During this plasma discharge a stable, measurable current and voltage is detected to verify the integrity of the seal as explained below.

Figure 3:
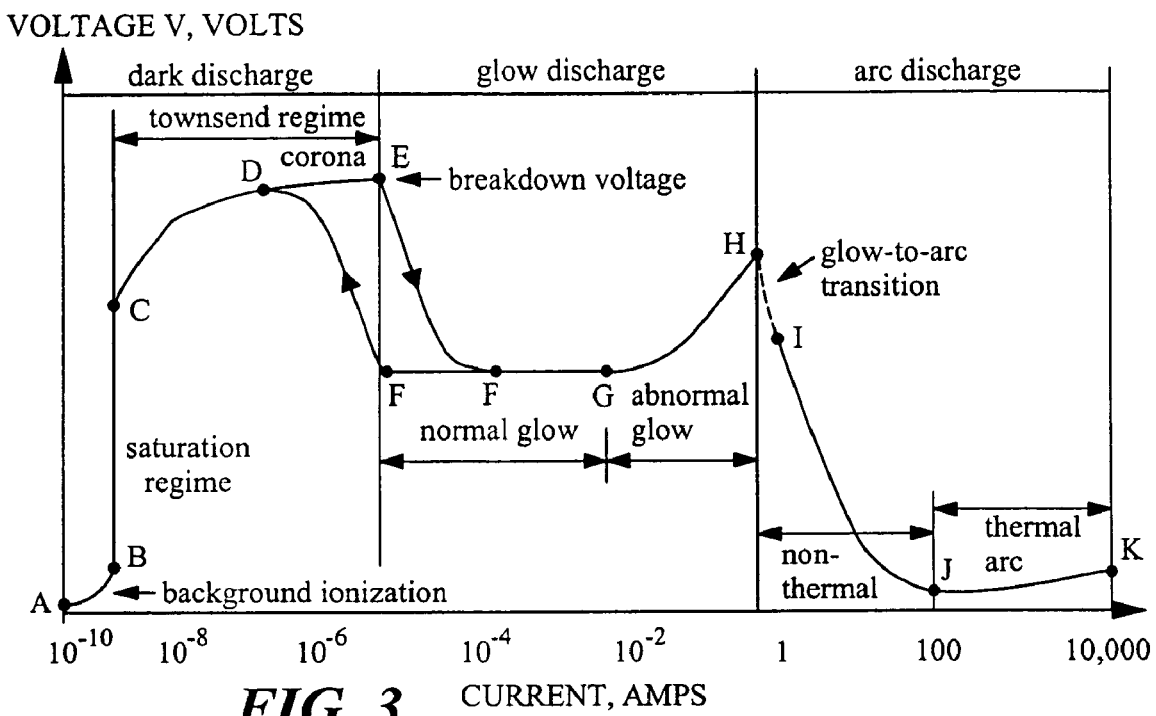
FIG. 3 is a generic current and voltage characteristic curve for plasma discharge.

FIG. 3 depicts a generic Current and Voltage (I/V) curve for a typical direct current (DC) plasma discharge initiated between two electrodes similar to that described above. The main electrical characteristics of the plasma discharge such as the breakdown voltage and the voltage current characteristics depend primarily on:

1. The attributes of the electrodes, i.e. the geometry of the electrodes, the electrode material, and distance between the tips of the electrode pair; and 2. The gaseous environment within the sealed cavity, i.e. the molecular make-up and the gas pressure of the gas within the sealed cavity.

Most often, sealing takes place in a deliberately controlled atmosphere. Thus, there exists either by design or natural processing, a difference in the critical environmental characteristics for plasma discharge between the sealed environment and the exterior environment in which the sealed semiconductor device operates. This is achieved by creating a seal wherein the sealed environment is generated at a different pressure, in a different gas or both than that of the outside environment. Electrodes 22 and 24 are preferably photolithographically formed using standard semiconductor techniques. If the seal, for instance the seal formed by the sealant 18, is compromised or malformed, the sealed environment and the exterior environment mix rapidly, inherently changing the critical environmental characteristics inside the cavity 20, thus rendering the voltage and current response of the plasma discharge inside a sealed cavity different than that of an unsealed cavity.

Figure 4:
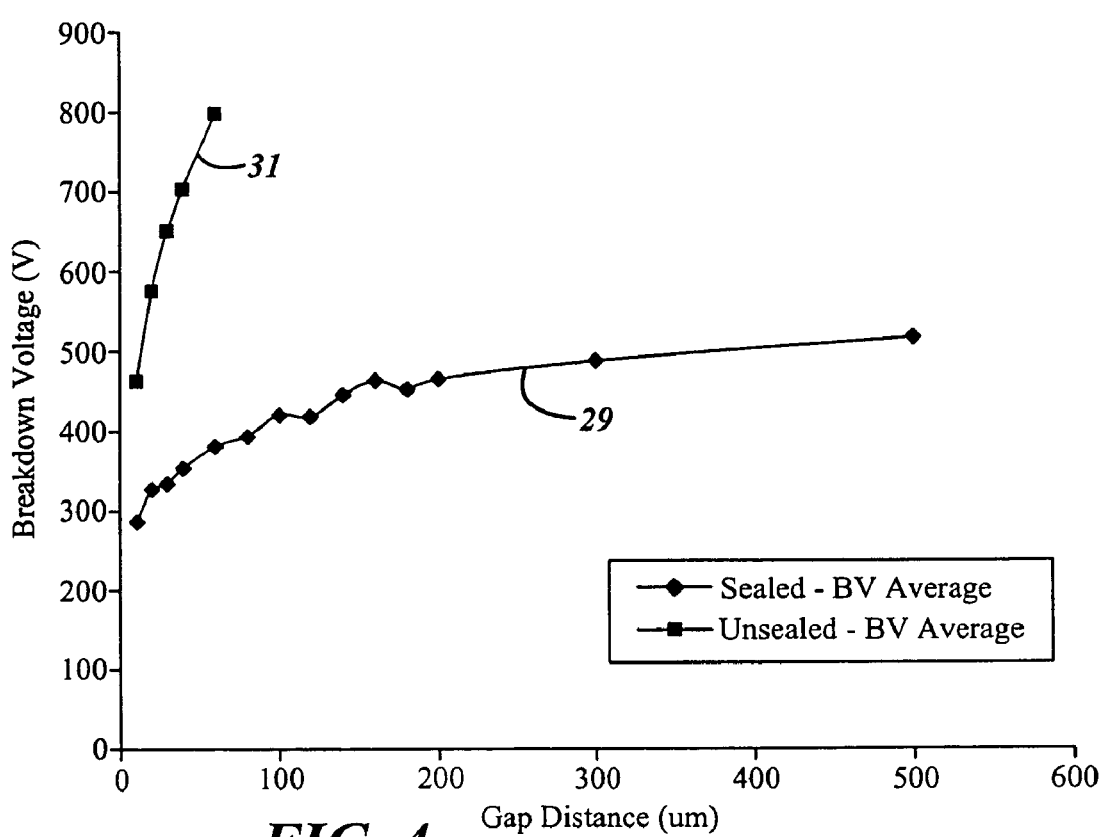
FIG. 4 is a graph of the break down voltage for sealed and unsealed semiconductor devices plotted as a function of the gap distance between electrode terminations.

Although several points along the plasma I/V curve depicted in FIG. 3 can be utilized, one such method which exploits the difference in breakdown voltage is described. FIG. 4 is a graph of the break down voltage for sealed and unsealed semiconductor devices plotted as a function of the gap distance d between the tips of electrode terminations 25 and 27. Curve 29 illustrates the breakdown voltage for a typical gaseous environment inside a sealed cavity such as the sealed cavity 20, for example, argon at 0.4 atmospheres. On the other hand, curve 31 illustrates the breakdown voltage for a typical exterior gaseous environment outside the sealed cavity, for example, air at 1.0 atmospheres. If cavity 20 is not properly sealed, the exterior gaseous environment leaks into the cavity 20 and mixes with the gaseous environment inside cavity 20 rapidly resulting in a contaminated gaseous environment inside the cavity 20. The make-up of the contaminated gaseous environment that results when the cavity 20 is not sealed properly can be predicted. In any event, curve 31 of FIG. 4 illustrates that the breakdown voltage for a contaminated gaseous environment in an unsealed cavity (like the exterior gaseous environment) is typically considerably higher than the breakdown voltage for desired gaseous environment in a sealed cavity. Thus, the integrity of the seal provided by the sealant 18 may be tested by applying a test bias voltage to electrodes 22 and 24 that is higher than the expected breakdown voltage of the gaseous environment that should be in the sealed cavity 20 when it is properly sealed but less than the breakdown voltage of a contaminated gaseous environment that may be in the cavity 20 due to a faulty seal. Returning now to FIG. 3 it is evident that the sealed device will create a plasma with measurable current and the contaminated device will not.

It is also evident from FIG. 3 that the resulting current draw from the sealed device will increase until arc, which is catastrophic. This would be damaging to both the electrodes and the MEMS device inside the cavity. Thus, it is the preferred embodiment of this invention to operate the seal verification structure of the semiconductor device 10 in the normal glow regime, F-G, as it is here where the plasma is both well behaved and results is no damage to the electrode structure or the MEMS device. This is done by clamping the current at a value that maintains the plasma in the normal glow region F-G. In this case, a bias voltage higher than the expected breakdown voltage of the gaseous environment that should be in the cavity 20 but less than the breakdown voltage of a contaminated gaseous environment that may be in the cavity 20 due to a faulty seal, is applied between the electrode pair 22, 24. When applying the voltage, the current is clamped at a current sufficient to create plasma discharge but insufficient to create an arc, in turn creating a normal glow plasma discharge in a properly sealed semiconductor device 10 and no discharge in a semiconductor device with a faulty seal. This would be indicated electrically by the sealed device creating a current draw equal to the current clamp whereas the current draw of the device with the faulty seal is virtually immeasurable. It is preferable to operate the verification structure for a semiconductor device in this manner because a static test which uses a standard semiconductor source measurement unit (SMU) test platform operates well. A similar response can be achieved through the application of an alternating current (AC) bias of the electrode pair 22, 24 or by more complex dynamic tests.

For instance, applying a test voltage of 400 volts to the electrodes of 22 and 24 of a properly sealed device 10 that have the electrode tips spaced at a predetermined distance of 50 micrometers produces a plasma discharge with electrical characteristics as shown by FIG. 4 and by FIG. 3. On the other hand, neither a plasma discharge nor a measurable current are produced in a leaky device where the gas inside the cavity 20 is contaminated. Thus the integrity of the seal is tested simply by applying the proper test bias to the electrodes 22, 24 and determining whether or not a plasma discharge occurs by measuring the current flowing between electrodes 22, 24. Alternatively, determining whether or not a plasma discharge occurs can be made by observing whether or not the normal glow (or other phenomenon) produced by a plasma discharge occurs.

It is also evident from FIG. 3 that a test bias current (rather than voltage) could be applied to the electrodes 22, 24 and a determination made of whether or not plasma discharge occurred at the test bias current by measuring voltage or by observing whether or not the normal glow (or other phenomenon) produced by a plasma discharge occurs.

Since sealing most often takes place in a deliberately controlled atmosphere, the pressure and molecular make-up of the gas that should be in a properly sealed cavity can be controlled to reduce the breakdown voltage and thus enhance the distinction between the breakdown voltage of the gas in a properly sealed cavity and the breakdown voltage of a contaminated gas in the cavity due to a faulty seal.

Since most devices operate in an ambient atmospheric air environment, sealing gases such as nitrogen, helium, argon and other noble gases of the Group VIII elements of the periodic table can be used to create further resolution between sealed and unsealed responses. Further the reduction or increase of pressure within the sealed chamber can also be used to enhance the discrimination between sealed and unsealed chambers.

With proper design a difference in the breakdown voltage in excess of 500V is easily achievable in many instances providing ample range and resolution to create a highly discriminating method.

Passivation on the electrodes 22, 24 up to but not including the tips of the terminations 25, 27 is preferred but not necessary. Alternatively, the electrodes 22, 24 could be fully passivated but such a structure would have to be interrogated for seal integrity by applying an alternating current (AC) bias on the electrodes 22, 24. The fully passivated electrodes can also be utilized to determine if the passivation is properly applied by applying a direct current (DC) bias voltage sufficient to produce a plasma discharge in the sealed cavity. If a plasma discharge does occur, then the passivation is not properly applied.

The seal verification structure comprising electrodes 22, 24 and the gaseous environment inside the sealed cavity 20 is preferably designed such that the breakdown voltage is less than the voltage required to breakdown the dielectric supporting the electrodes in arrangements where this consideration is important.

In the case of most MEMS, it is necessary that devices created inside the hermetic sealed cavity be electrically connected outside the sealed cavity. This is most often achieved by utilizing standard semiconductor interconnect technology comprised of, metals (such as alloys of Al, Cu, Au, Pt, etc.), polysilicon, or doped semiconductor achieved through implant, epitaxy, or some combination thereof which constitutes the interconnect material. This interconnect is typically photolithographically processed.

The electrodes 22, 24 for the seal verification structure 10 are preferably but not necessarily made both of the same material and in the same photolithography step as any other interconnect technology that may be required for structure 10. Thus any additional process steps during MEMs fabrication or post-sealing required for the formation, stimulation or activation of the seal interrogating structure or method may be avoided.

The spacing d between the tips of the electrodes is chosen based on the characteristics of the sealed and outside gaseous environments in order to achieve a workable difference between the I/V characteristics of the plasma in the cavity when the cavity is sealed and when the cavity is unsealed. A choice which minimizes the breakdown voltage required for initiation of the plasma discharge, and maximizes the difference between the I/V characteristics of the plasma in the sealed and unsealed conditions is optimal.

The design of the electrodes 22, 24 and the gaseous environment of sealed cavity 20 for the MEMS or other semiconductor device inside the sealed cavity cannot always be tailored independently without affecting performance of the MEMS device. However, typically one or two design parameters always can be controlled to create a sufficient difference between the sealed and unsealed responses to the test bias to make seal verification by the plasma discharge method readily possible.

Figure 5:
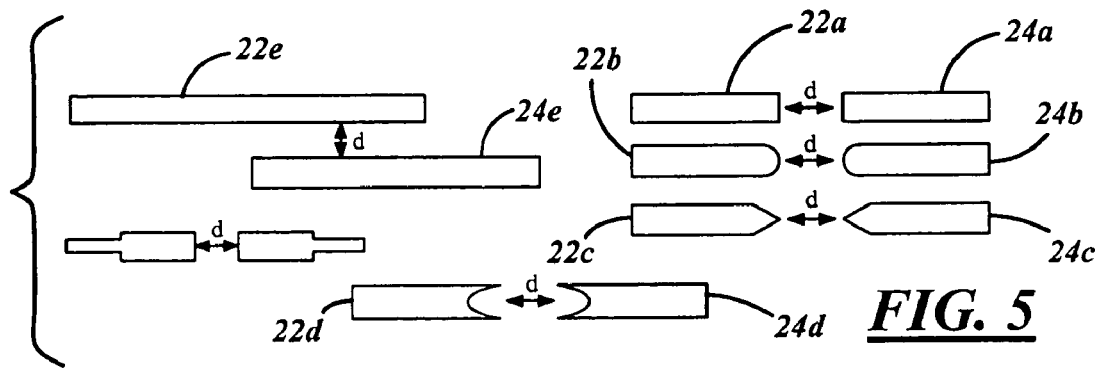
FIG. 5 shows various electrode terminations for the semiconductor device shown in FIGS. 1 and 2.

While the terminations 25 and 27 of electrodes 22, 24 are depicted as having pointed tips, other shapes for the tips are possible. FIG. 5 shows several alternate possibilities including square tipped electrodes 22a, 24a; convex tipped electrodes 22b, 24b; point tipped electrodes 22c, 24c and concave tipped electrodes 22d, 24d. The electrodes may even be vertically rather than horizontally spaced such as indicated by electrodes 22e, 24e.

Figure 6:
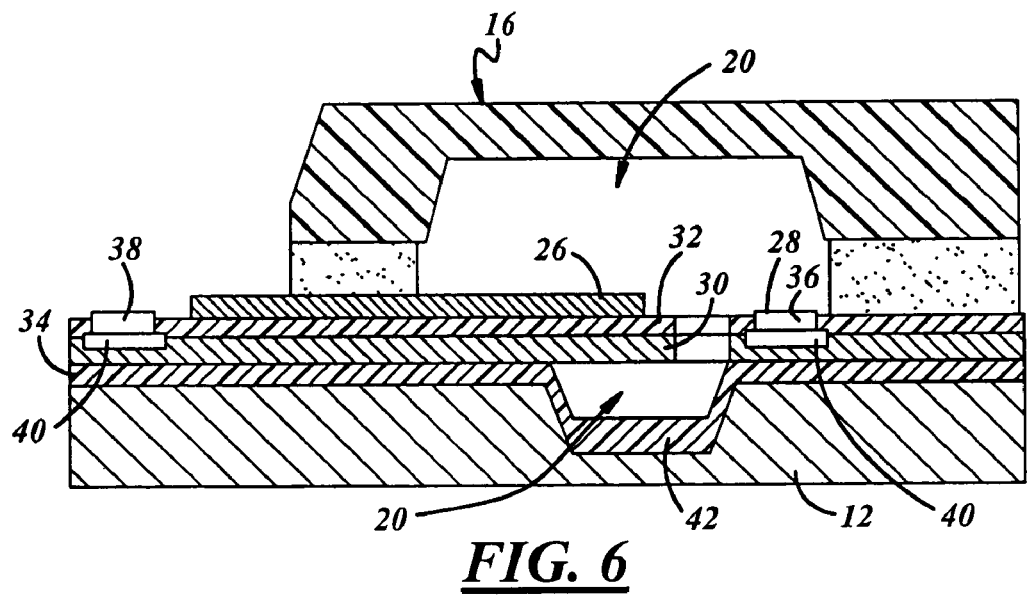
FIG. 6 is a cross-sectional view of another semiconductor device that includes alternative seal verification structures for verifying a hermetic seal in accordance with the invention.

FIG. 6 depicts another semiconductor device that includes alternative seal verification structures having different electrode arrangements, which can be used for seal verification in accordance with this invention. For example, a pair of electrodes 26, 28 may be used in which an epitaxal device wafer 30 that is sandwiched between dielectric layers 32, 34 is used as part of the electrode 28. Electrode 28 thus includes internal and external contacts 36 and 38 that may be attached to the epitaxal device wafer 30 with or without respective enhancements 40. This allows further miniaturization of the seal verification structure. Furthermore, the silicon cap wafer 16 itself may be used to provide a second electrode that may be used in conjunction with electrode 26. Silicon device wafer 12 also may be used to provide a second electrode that may also be used in conjunction with electrode 26. However in this case, a portion of dielectric layer 34, such as portion 42 must be removed to expose a portion of device wafer 12. Any two electrodes of the group of electrodes comprising device wafer 12 (with an exposed portion), cap wafer 16, and electrode 26 and electrode 28 may be used, it being understood that only two of the electrodes of the group are necessary to practice the invention.

It may be possible that independent dedicated electrodes may not be required to create a seal verification structure. Instead adjacent interconnect features already employed in the MEMS or semiconductor device design may be utilized in some cases provided a gap distance d, such as the gap distance d shown in FIG. 4 to produce a stable plasma discharge at a reasonable breakdown voltage, exists between the interconnect features.

The method and seal verification structure of this invention relies completely on the sealed environment and not on a secondary outside physical stimulant, such as a water soak. Thus the method and seal verification structure of this invention may not only be used to verify the integrity of the hermetic seal but also to verify that the environment within the sealed cavity was properly created; the proper environment creation also being verified by the characteristic response of the plasma discharge.

A seal such as that provided by sealant 18 is intended to remain hermetic throughout the useful life of the sealed semiconductor device. There is occasion however, when in operation, especially in harsh environments that such a seal can be compromised. The method and seal verification structure of this invention can be used to test the seal integrity throughout the life of the semiconductor device because the characteristics of the sealed environment react to the internal electrode stimuli rather than relying on an outside stimulant such as water soak.

While the method and structure of this invention have been described in connection with a MEMS application other applications are also possible. Semiconductors, thick-film ceramics, printed circuit boards, etc. sealed in hermetic environments such as transistor outline (TO) cans, semiconductor packages, etc. can also utilize the plasma discharge seal verification method and structure of this invention.

The discharge of a plasma is not only characterized by an electrical response but also a spectroscopic one. Consequently, detection of ultraviolet (UV) or visible radiation can be used instead of electrical detection so long as a portion of the sealing vessel is translucent to the appropriate radiation.

The use of a plasma discharge to verify a hermetic seal offers several advantages over the prior art. These advantages include the elimination of additional processing required for the formation of other structures and methods, which reduces cost and complexity, requires no outside stimulant for activation or verification, is robust to defects which with other structures and methods render inappropriate decisions as to seal quality/integrity, utilizes a simple structure and method that is easily integrated into any device which employs the use of a conductor or semiconductor, is applicable to wafer level, device level and package level seals, and further has the ability to determine the characteristics/quality of the environment within the seal.

It will be readily understood by those persons skilled in the art that the present invention is susceptible of broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

We claim:

1. A method for verifying a characteristic of a device having a sealed cavity, said method comprising the steps of:
    applying an electrical bias to spaced electrodes in the sealed cavity, the electrical bias being sufficient to produce a plasma discharge in a sealed cavity but not in an unsealed cavity;
    detecting an electrical response arising in response to applying the electrical bias; and
    verifying the characteristic of the device based on a difference of the electrical response and an electrical characteristic of the electrical bias that is indicative of a plasma discharge.

2. The method as defined in claim 1, wherein the electrical bias is a direct current bias voltage that is applied to the spaced electrodes, and the electrical characteristic is indicative of a hermeticity of the sealed cavity.

3. The method as defined in claim 1, wherein the electrical bias is an alternating current bias that is applied to the spaced electrodes, and the electrical characteristic is indicative of a hermeticity of the sealed cavity.

4. The method as defined in claim 1, wherein the electrical bias is an alternating current bias that is applied to the spaced electrodes, and the electrical characteristic indicates if the spaced electrodes are passivated.

5. A method for verifying hermeticity of a hermetically sealed cavity comprising the steps of:
    forming a pair of spaced electrodes in the hermetically sealed cavity,
    applying an electrical bias between the pair of spaced electrodes sufficient to produce a plasma discharge in the hermetically sealed cavity,
    detecting an electrical characteristic arising in response to applying the electrical bias indicative of the plasma discharge to verify the hermeticity of the hermetic seal, and
    verifying the hermeticity of the hermetic seal based on a difference of the electrical characteristic and an electrical characteristic that is indicative of a plasma discharge.

6. The method for verifying the hermeticity of a hermetically sealed cavity as defined in claim 5, wherein the pair of spaced electrodes extend from terminations inside the hermetically sealed cavity to contacts outside the hermetically sealed cavity, the terminations inside the hermetically sealed cavity having tips that are spaced apart a predetermined distance; and the electrical bias is applied to the contacts of the pair of spaced electrodes that are outside the hermetically sealed cavity with the electrical bias being sufficient to produce a plasma discharge inside a properly sealed cavity but not inside an unsealed cavity.

7. The method as defined in claim 6, wherein the electrical bias is a direct current bias that is applied between the contacts.

8. The method as defined in claim 6, wherein the electrical bias is an alternating current bias that is applied between the contacts.

9. The method as defined in claim 6, wherein the electrical bias is a predetermined electrical current bias that is applied between the contacts and the electrical characteristic detected is a voltage of the plasma discharge that is measured.

10. The method as defined in claim 6, wherein the electrical bias is a predetermined electrical bias voltage applied between the contacts and the electrical characteristic detected is a current of the plasma discharge that is measured.

11. The method as defined in claim 10, wherein the current of the plasma discharge is clamped at a current that is higher than the current corresponding to the breakdown voltage of the plasma discharge but lower than the current corresponding to an arching between the electrodes.

12. The method as defined in claim 11, wherein the current of the plasma discharge is clamped at a current that lies within a current range in the normal glow region of the plasma discharge.

13. A method for verifying hermeticity of a hermetically sealed cavity in a device comprising the steps of:
   forming a pair of spaced electrodes on the device extending from terminations inside the hermetically sealed cavity to contacts outside the hermetically sealed cavity, the terminations inside the sealed cavity having have tips that are spaced apart a predetermined distance;
   determining electrical characteristics of a plasma discharge inside the sealed cavity when the sealed cavity is filled with a predetermined gaseous medium,
   determining electrical characteristics of a plasma discharge inside the sealed cavity when the predetermined gaseous medium is contaminated by a gaseous medium outside the cavity;
   applying an electrical bias between the contacts of the pair of spaced electrodes outside the hermetically sealed cavity sufficient to produce a plasma discharge inside the sealed cavity when the sealed cavity is filled with the predetermined gaseous medium
   detecting an electrical response arising in response to applying the electrical bias; and
   verifying the hermeticity of the hermetically sealed cavity by detecting a difference of the electrical response and the electrical characteristics indicative of a presence of a plasma discharge in the hermetically sealed cavity.

14. A device comprising:

a hermetically sealed cavity, a plasma discharge generating means in the hermetically sealed cavity, and an electrical characteristic detection means for detecting an electrical characteristic arising in response to applying the electrical bias, and indicative of a presence of the plasma discharge generated in the sealed cavity to verify hermeticity of the hermetically sealed cavity based on a difference of the electrical characteristic and an electrical characteristic of the electrical bias that is indicative of a plasma discharge.

* * * * *